(12) United States Patent
Chen et al.

(10) Patent No.: US 8,530,358 B2
(45) Date of Patent: Sep. 10, 2013

(54) VERTICAL CAVITY SURFACE EMITTING LASER AND MANUFACTURING METHOD THEREOF

(75) Inventors: Po-Han Chen, Chishang Township, Taitung County (TW); Cheng-Ju Wu, Zhubei (TW); Jin-Shan Pan, Hsinchu (TW)

(73) Assignee: True Light Corporation, Hsinchu (TW)

( * ) Notice: Subject to any disclaimer, the term of this patent is extended or adjusted under 35 U.S.C. 154(b) by 140 days.

(21) Appl. No.: 13/231,904

(22) Filed: Sep. 13, 2011

(65) Prior Publication Data

US 2013/0064263 A1    Mar. 14, 2013

(30) Foreign Application Priority Data

Sep. 14, 2010   (TW) .............................. 99131016 A

(51) Int. Cl.
*H01L 21/302*     (2006.01)
(52) U.S. Cl.
USPC ........ 438/736; 257/E33.069; 438/29; 438/39; 372/94
(58) Field of Classification Search
CPC ....... H01S 5/00; H01S 5/183; H01S 5/18333; H01S 5/18313; H01S 5/18338; H01S 5/18355; H01L 33/005; H01L 33/0062
USPC ........... 372/6, 94, 103, 50.12, 50.124, 50.11, 372/43.01, 45.01, 46.01, 46.013, 46.015; 257/E33.001, E33.069; 438/29, 7, 14, 8, 438/16, 22, 39, 736
See application file for complete search history.

(56) References Cited

U.S. PATENT DOCUMENTS

| | | | |
|---|---|---|---|
| 6,885,690 B2* | 4/2005 | Aggerstam et al. | 372/96 |
| 7,095,771 B2* | 8/2006 | Biard et al. | 372/46.01 |
| 2003/0007531 A1* | 1/2003 | Aggerstam | 372/46 |
| 2003/0063642 A1* | 4/2003 | Aggerstam et al. | 372/45 |
| 2011/0002353 A1* | 1/2011 | Sekiguchi | 372/46.01 |

\* cited by examiner

*Primary Examiner* — Stephen W Smoot
*Assistant Examiner* — Pavel Ivanov
(74) *Attorney, Agent, or Firm* — Chun-Ming Shih; HDLS IPR Services

(57) ABSTRACT

The present invention discloses a manufacturing method of vertical cavity surface emitting laser. The method includes following steps: providing a substrate; forming an epitaxial layer stack including an aluminum-rich layer; forming an ion-doping mask including a ring-shaped opening; doping ions in the epitaxial layer stack through the ring-shaped opening and forming a ring-shaped ion-doped region over the aluminum-rich layer; forming an etching mask on the ion-doping mask for covering the ring-shaped opening of the ion-doping mask; etching the epitaxial layer stack through the etching mask and ion-doping mask for forming an island platform; oxidizing the aluminum-rich layer for forming a ring-shaped oxidized region. In addition, the present invention also discloses a vertical cavity surface emitting laser manufactured by the above mentioned method.

5 Claims, 6 Drawing Sheets

US 8,530,358 B2

VERTICAL CAVITY SURFACE EMITTING LASER AND MANUFACTURING METHOD THEREOF

BACKGROUND OF THE INVENTION

1. Field of the Invention

The present invention relates to a laser device, in particularly to a vertical cavity surface emitting laser and a manufacturing method of the same.

2. Description of Related Art

Vertical cavity surface emitting laser (VCSEL) has a primary feature of emitting light in a direction substantially perpendicular to the top surface of the laser chip. VCSEL is formed to have multiple layer structure of the epitaxial layer stack by deposition method like metal organic chemical vapor deposition (MOCVD) or molecular beam epitaxy (MBE) with other conventional semiconductor steps.

The epitaxial layer stack includes an active region as the light emitting region, and two distributed Bragg reflectors (DBRs) arranged at opposite sides of the active region. A laser resonant cavity is formed between the two distributed Bragg reflectors, for the two distributed Bragg reflectors reflect the light with specific wavelength generated from the active region. Consequently, the light is amplified in the laser resonant cavity. For obtaining better optoelectronic characteristics, a current confinement aperture is usually formed within the upper side distributed Bragg reflector to confine the path of electric current. Thus, the threshold current can be decreased and the efficiency of optoelectronic conversion can be increased.

The conventional method used for manufacturing the current confinement aperture includes ion doping and selective oxidation. The two methods both have their advantages and disadvantages. FIG. 1 shows a conventional VCSEL adopts both methods for confining electric current. The epitaxial layer stack 10 has not only an ion-doped confinement region 11, but also an oxidizing confinement region 12 over the ion-doped confinement region 11. The ion-doped confinement region 11 has a confinement aperture 110. The oxidized confinement region 12 also has a confinement aperture 120. The confinement aperture 120 of the oxidized confinement region 12 is aligned with the confinement aperture 110 of the ion-doped confinement region 11. The VCSEL has better electric current confinement and better spectrum properties.

In practical manufacturing of the VCSEL, two sets of semiconductor processes need to be performed on the epitaxial layer stack 10 for forming the ion-doped confinement region 11 and the oxidized confinement region 12. However, due to overlay misalignment in semiconductor processes, the confinement aperture 110 of ion-doped confinement region 11 is usually not perfectly aligned with the confinement aperture 120 of the oxidized confinement region 12. Any slightly misalignment can downgrade the electric current confinement properties and de-optimize the spectrum properties.

SUMMARY OF THE INVENTION

The objective of the present invention is to provide a manufacturing method of vertical cavity surface emitting laser in which an ion-doped confinement aperture is self-aligned with the oxidized confinement aperture, capable of improving the electric current confinement and the spectrum properties.

For achieving the above mentioned objective, the present invention provides a manufacturing method of vertical cavity surface emitting laser, including the following steps: providing a substrate; forming an epitaxial layer stack comprising an aluminum-rich layer on the substrate; forming an ion-doping mask comprising a ring-shaped opening; doping ions into the epitaxial layer stack and forming a ring-shaped ion-doped region over the aluminum-rich layer; forming an etching mask for covering the ring-shaped opening of the ion-doping mask; etching the epitaxial layer stack through the ion-doping mask and etching mask for forming an island platform; and oxidizing the aluminum-rich layer for forming a ring-shaped oxidized region.

The vertical cavity surface emitting laser made by the above mentioned manufacturing method includes a substrate and an epitaxial layer stack formed on the substrate and comprising a ring-shaped ion-doped region and a ring-shaped oxidized region under the ion-doped region. The ion-doped region includes an ion-doped aperture and the oxidized region includes an oxidized aperture which is aligned with the ion-doped aperture.

DETAILED DESCRIPTION OF THE INVENTION

A detailed description of the present invention will be made with reference to the accompanying drawings.

Figure 1:
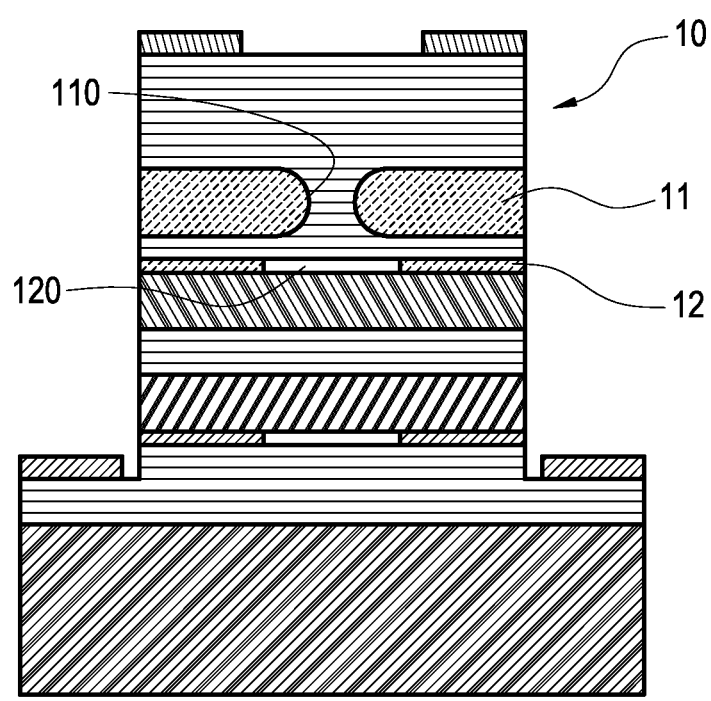
FIG. 1 is a cross sectional view showing a conventional vertical cavity surface emitting laser.
Figure 2:
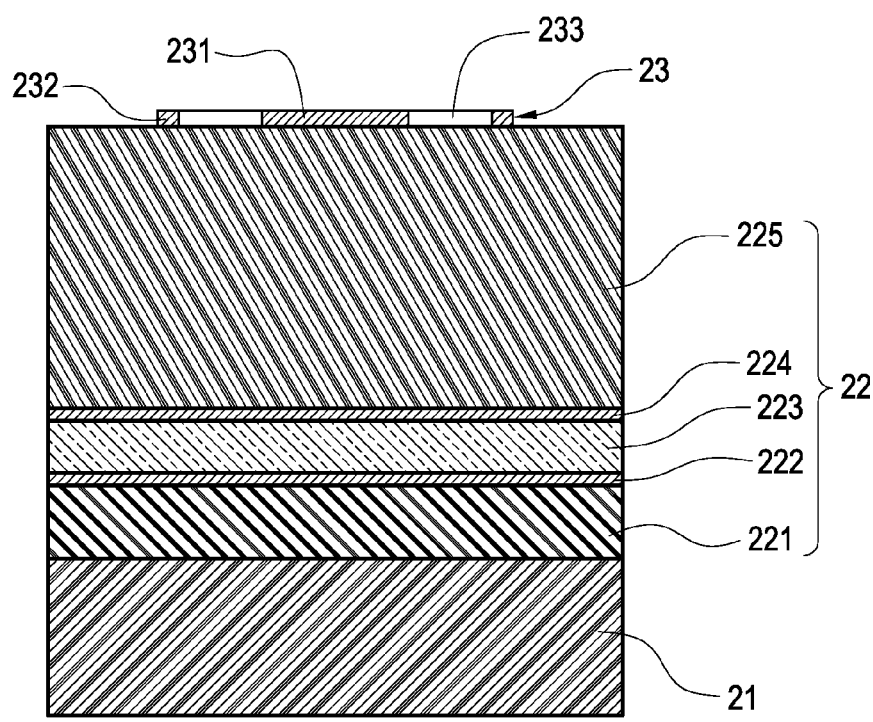
FIG. 2 is a cross sectional view showing a vertical cavity surface emitting laser of the present invention.

The manufacturing method of vertical cavity surface emitting laser of the present invention includes the following steps. In the beginning, as FIG. 2 shows, a substrate 21 is provided. An epitaxial layer stack 22 is then formed on the substrate 21. The epitaxial layer stack 22 is, but not limited to, based on compound semiconductor like AlGaAs/GaAa system. In practical use, the epitaxial layer stack 22 can be AlN/GaN/InGaN system, which can be determined according to the color of laser light chosen. The color of laser light can be, but not limited to, infrared, visible or ultraviolet.

More specifically, the epitaxial layer stack 22 on the substrate 21 includes a first distributed Bragg reflector 221, a first isolating layer 222, an active region 223, a second isolating layer 224 and a second distributed Bragg reflector 225. The first distributed Bragg reflector 221 and the second distributed Bragg reflector 225 each have multiple stacked layers for reflecting light. The active region 223 can have multiple stacked layers. The second distributed Bragg reflector 225 has an aluminum-rich layer (not shown) in its stacked layers.

Figure 3:
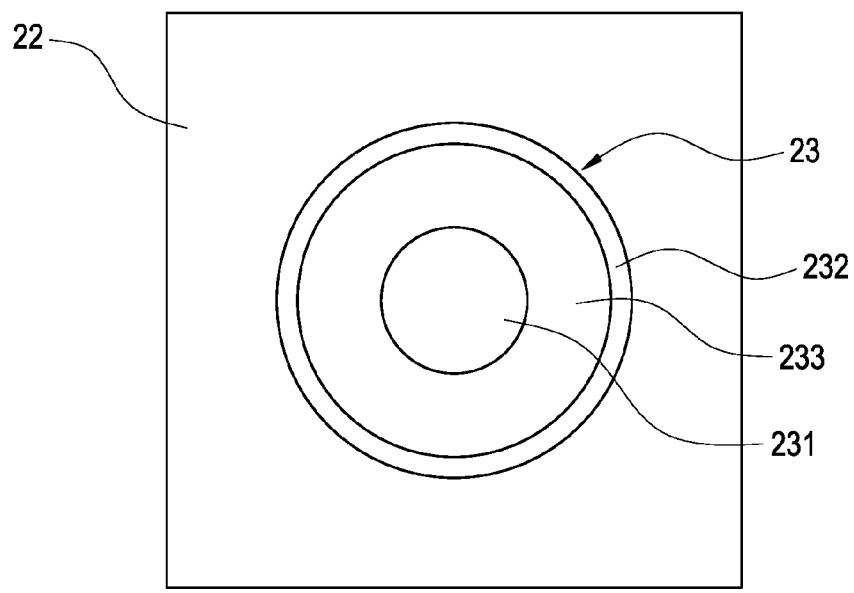
FIG. 3 is a top view showing the vertical cavity surface emitting laser of the present invention.

After that, an ion-doping mask 23 is formed on the epitaxial layer stack 22 by semiconductor process. The ion-doping mask 23 is a silicon nitride thin film processed by lithography and etching steps. In practical, the material of the ion-doped mask 23 is not limited. As FIG. 3 shows, the ion-doped mask 23 on the epitaxial layer stack 22 includes a circular portion 231, and an outer ring portion 232 around the circular portion 231. The circular portion 231 and the outer ring portion 232 are coaxial. And a ring-shaped opening 233 is defined between the circular portion 231 and the outer ring portion 232.

Figure 4:
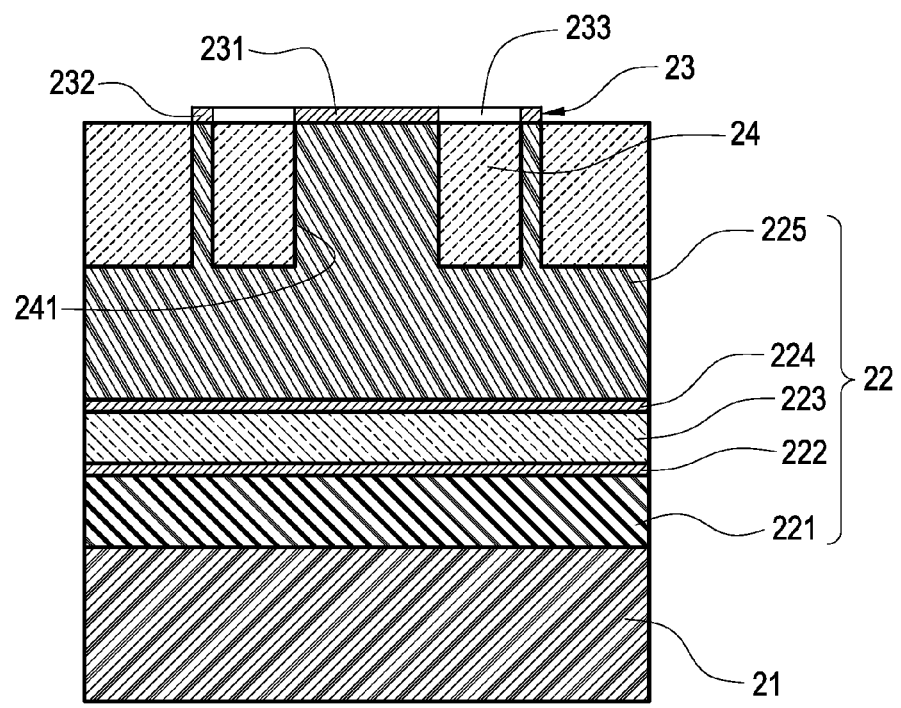
FIG. 4 is a cross sectional view showing the vertical cavity surface emitting laser of the present invention.

Then, as FIG. 4 shows, ions are doped into the epitaxial layer stack 22 through the ring-shaped opening 233 of the ion-doping mask 23 and a ring-shaped ion-doped region 24 is formed in the second distributed Bragg reflector 225. The ring-shaped ion-doped region 24 has an ion-doped aperture 241. The center of the ion-doped aperture 241 is aligned with the center of the ion-doping mask 23.

Figure 5:
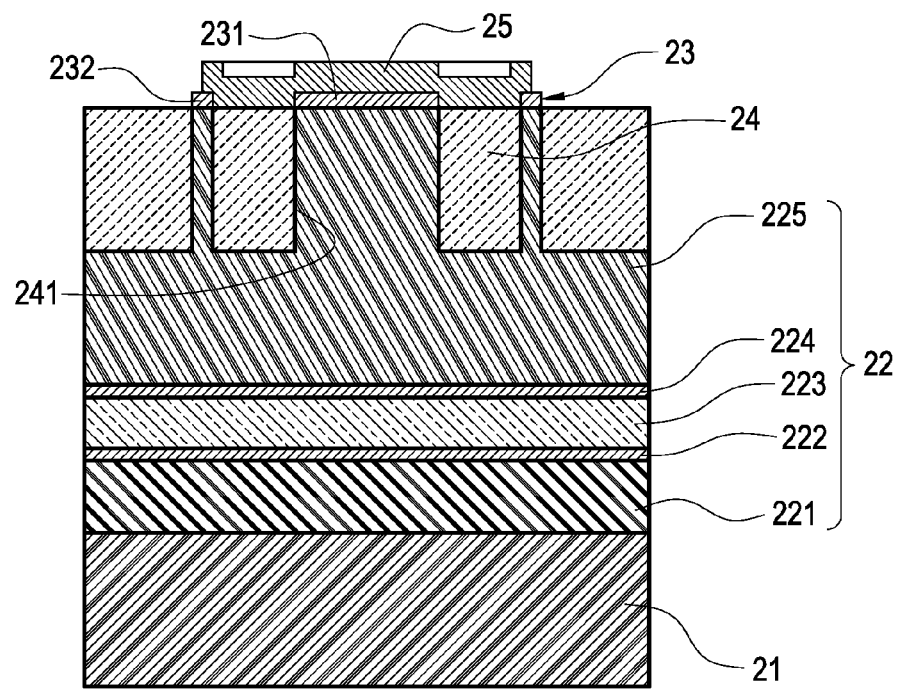
FIG. 5 is a cross sectional view showing the vertical cavity surface emitting laser of the present invention.
Figure 6:
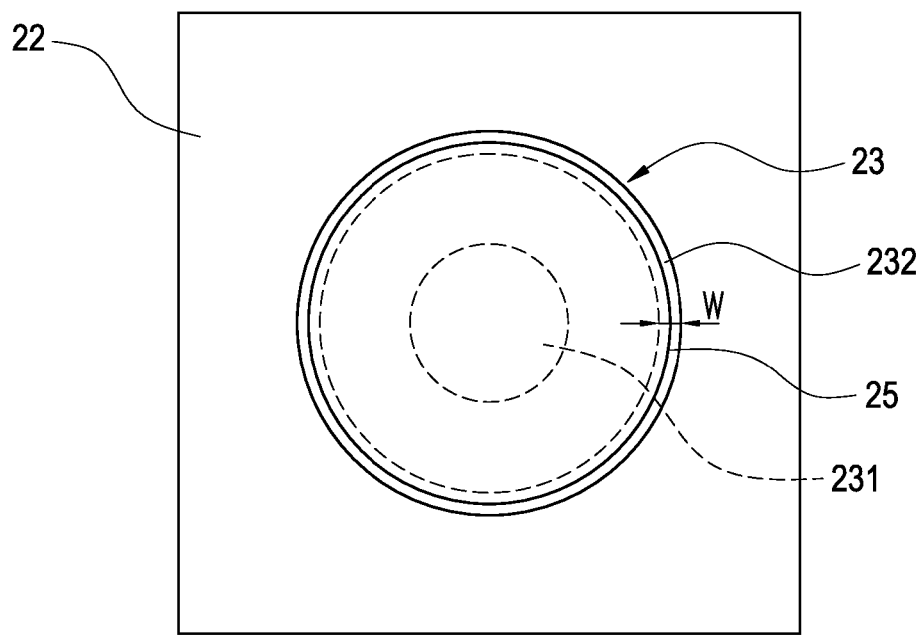
FIG. 6 is a top view showing the vertical cavity surface emitting laser of the present invention.

Then, as FIG. 5 shows, an etching mask 25 is formed on the ion-doping mask 23 by semiconductor process, for covering the ring-shaped opening 233 of the ion-doping mask 23. The etching mask 25 is a silicon nitride film processed by lithography and etching steps. In practical, the material of the etching mask 25 is not limited. As FIG. 6 shows, the etching mask 25 is of circular shape and used for covering the ring-shaped opening 233 of the ion-doping mask 23 and protecting the ring-shaped ion-doped region 24. It should be mentioned that the outer edge of the etching mask 25 is fully located within the top surface of the outer ring portion 232. The etching mask 25 at least covers the circular portion 231 and the ring-shaped opening 233 and does not exceed the outer edge of the outer ring portion 232.

Figure 7:
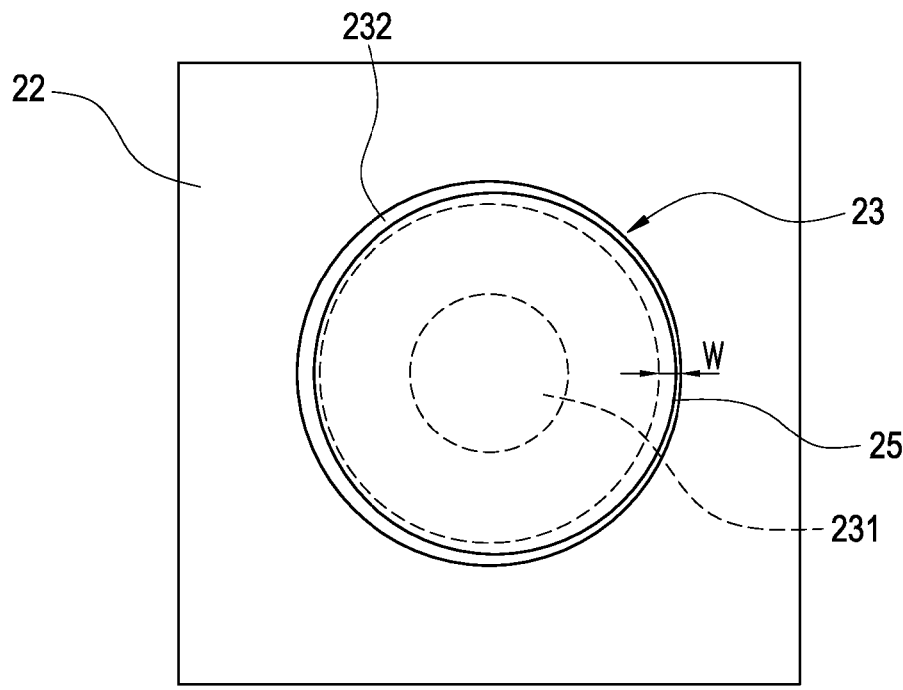
FIG. 7 is a top view showing the vertical cavity surface emitting laser of the present invention.

The width W of the outer ring portion 232 is determined by the available minimum overlay misalignment of the semiconductor process equipment. As FIG. 7 shows, when the overlay misalignment of the semiconductor process equipment causes the center of the etching mask 25 not aligned with the center of the ion-doped mask 23, the outer edge of the etching mask 25 remains fully on the outer ring portion 232 of the ion-doping mask 23. In other words, the width W of the outer ring portion 232 can be used to tolerate the overlay misalignment of the semiconductor process equipment. If the overlay misalignment of the semiconductor process equipment is larger, the width W of the outer ring portion 232 should be increased to remain the outer edge of the etching mask 25 on the outer ring portion 232 of the ion-doping mask 23.

Figure 8:
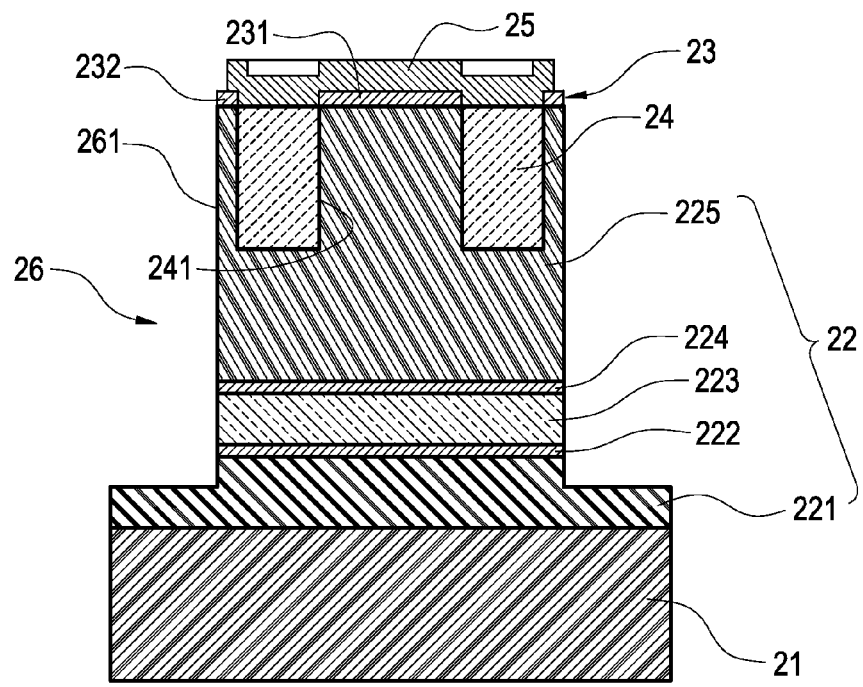
FIG. 8 is a cross sectional view showing the vertical cavity surface emitting laser of the present invention.

Then, as FIG. 8 shows, through the ion-doping mask 23 and the etching mask 25, the epitaxial layer stack 22 is etched to the first distributed Bragg reflector 221 and an island platform 26 is formed. Since the outer edge of the etching mask 25 is fully located within the top surface of the outer ring portion 232 of the ion-doping mask 23, the edge of the island platform 26 coincides with the edge of the ion-doping mask 23. And, the center of the island platform 26 is aligned with the center of the ion-doping mask 23 and the center of the ion-doped aperture 241.

Figure 9:
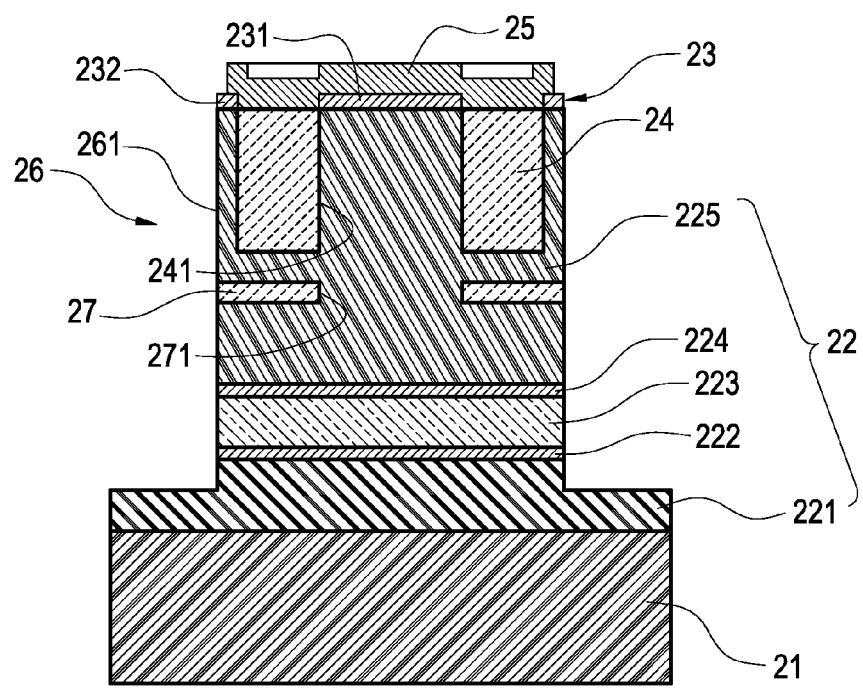
FIG. 9 is a cross sectional view showing the vertical cavity surface emitting laser of the present invention.

As FIG. 9 shows, the aluminum-rich layer of the second distributed Bragg reflector 225 is oxidized and a ring-shaped oxidized region 27 is formed between the ion-doped region 24 and the active region 223. The ring-shaped oxidized region 27 has an oxidized aperture 271. Since the oxidation of the ring-shaped oxidized region 27 is started from the peripheral surface 261 of the island platform 26 and is continued uniformly toward the center of the island platform 26, the center of the oxidized aperture 271 is aligned with the center of the center of the island platform 26 as well as the center of the ion-doped aperture 241. Thus, the index guiding effect in the oxidized region 27 can be lowered and electric current can be converged to increase the gain guiding effect and the spectrum properties is improved. Besides, it should be mentioned that when the dimension of the ion-doped aperture 241 is close to or less than the dimension of the oxidized aperture 271, the illumination mode will be dominated by the gain guiding effect and the spectrum of the light will be narrowed. More specifically, the difference between the diameter of the ion-doped aperture 241 and the diameter of the oxidized aperture 271 is within the range of 2 μm.

Figure 10:
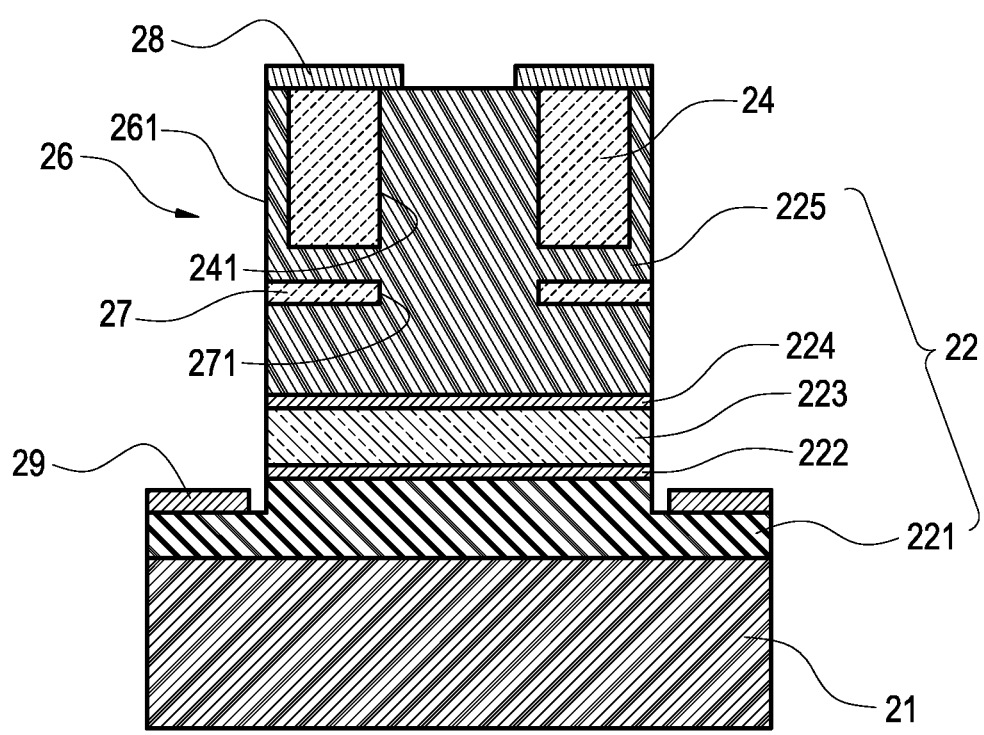
FIG. 10 is a cross sectional view showing the vertical cavity surface emitting laser of the present invention.

Finally, the ion-doping mask 23 and the etching mask 25 are removed. Then, as FIG. 10 shows, a first electrode 28 is formed on the second distributed Bragg reflector 225 by metal deposition process. A second electrode 29 is formed on the first distributed Bragg reflector 221 by metal deposition process. The manufacturing method of vertical cavity surface emitting laser is finished.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A manufacturing method of vertical cavity surface emitting laser, comprising the following steps:
   providing a substrate;
   forming an epitaxial layer stack comprising an aluminum-rich layer on the substrate;
   forming an ion-doping mask comprising a ring-shaped opening;
   doping ions into the epitaxial layer stack and forming a ring-shaped ion-doped region over the aluminum-rich layer;
   forming an etching mask for covering the ring-shaped opening of the ion-doping mask;
   etching the epitaxial layer stack through the ion-doping mask and etching mask for forming an island platform; and
   oxidizing the aluminum-rich layer for forming a ring-shaped oxidized region.

2. The manufacturing method of vertical cavity surface emitting laser as claim 1, wherein the forming of the epitaxial layer stack comprises forming a first distributed Bragg reflector, a second distributed Bragg reflector and an active region between the first distributed Bragg reflector and the second distributed Bragg reflector.

3. The manufacturing method of vertical cavity surface emitting laser as claim 2, wherein the aluminum-rich layer belongs to the second distributed Bragg reflector.

4. The manufacturing method of vertical cavity surface emitting laser as claim 1, wherein the forming of the ion-doping mask comprises forming a circular portion and an outer ring portion around the circular portion, the circular portion and the outer ring portion are coaxial and define the ring-shaped opening therebetween.

5. The manufacturing method of vertical cavity surface emitting laser as claim 4, wherein the etching mask at least covers the circular portion and the ring-shaped opening and does not exceed the outer ring portion.

* * * * *